United States Patent [19]

Peng et al.

[11] Patent Number: 4,904,964
[45] Date of Patent: Feb. 27, 1990

[54] VOLTAGE CONTROL OSCILLATOR WITH MODULATION COMPENSATION

[75] Inventors: Kwan K. Peng, Bukit Purmei Ro, Singapore; Leng H. Ooi, Sunrise, Fla.

[73] Assignee: Motorola, Inc., Schaumburg, Ill.

[21] Appl. No.: 290,728

[22] Filed: Dec. 27, 1988

[51] Int. Cl.[4] .................................................. H03L 7/00
[52] U.S. Cl. ......................................... 332/123; 331/16; 331/36 C; 331/177 V; 331/23
[58] Field of Search ................. 332/18, 30 V; 331/8, 331/10, 16, 25, 36 C, 177 V, 23; 455/113

[56] References Cited

U.S. PATENT DOCUMENTS

| | | | |
|---|---|---|---|
| 4,494,090 | 1/1985 | Popek et al. | 331/36 C X |
| 4,503,402 | 3/1985 | Englund, Jr. | 331/36 |
| 4,510,465 | 4/1985 | Rice et al. | 332/16 T |
| 4,649,353 | 3/1987 | Sonnenberg | 331/8 |
| 4,785,263 | 11/1988 | Kaltenecker et al. | 331/117 FE |

*Primary Examiner*—Eugene R. LaRoche
*Assistant Examiner*—Robert J. Pascal
*Attorney, Agent, or Firm*—Daniel K. Nichols; Juliana Agon

[57] ABSTRACT

An improved voltage controlled oscillator (VCO) is provided whereby the control voltage is utilized for modulation compensation by a modulation compensation network (90). The modulating signal is variably coupled into the voltage controlled oscillator (70) to compensate for the variation in the VCO's gain factor to yield a constant modulation level over a frequency band.

8 Claims, 1 Drawing Sheet

VOLTAGE CONTROL OSCILLATOR WITH MODULATION COMPENSATION

BACKGROUND OF THE INVENTION

This invention relates generally to phase-locked loop frequency synthesizers, and more particularly to wideband phase-locked loop frequency synthesizers that provide a flat modulation response.

In frequency synthesizers having voltage controlled oscillators (VCOs), obtaining a flat modulation response is difficult because of non-linear characteristics of the components comprising the VCO. Conventional VCOs typically utilize voltage variable capacitors commonly known as varactor diodes in their implementations. Normally these varactor diodes are arranged to parallel resonate with an inductor in a so-called "tank circuit", such that as the voltage (control voltage) applied to the varactor diodes varies, their capacitance change resulting in a shift in the resonant frequency of the oscillator. As a result, the oscillator frequency varies directly with the control voltage, albeit in a non-linear fashion. Described alternately, the higher the control voltage, the higher the oscillator frequency. Conversely, the lower the control voltage, the lower the oscillator frequency. In addition to oscillator frequency, the VCO's gain factor $K_o$ (expressed in MHz/volt) varies inversely with the control voltage, but also in a non-linear fashion. In other words, the VCO has a higher gain factor $K_o$ at lower control voltages, and a lower gain factor $K_o$ at higher voltages.

In a modulation system for use in a radio transmitter, the control voltage of the VCO is typically modulated with information signals, such as audio frequency signals to produce a resultant frequency modulated (FM) signal having the information signals appear spectrally as frequency deviations from a radio frequency carrier. However, to parallel resonate a fixed inductor over a frequency band to achieve constant deviation, a smaller variation in capacitance is required at the higher frequencies, while a greater variation in capacitance is required at the lower frequencies. Since the capacitance varies directly with the square root of the varactor diode voltage, at the lower frequencies, where a low level of control voltage is utilized, modulation may be quite high (because the voltage provided is not enough to vary the capacitance needed and the gain factor $K_o$ is too high for a constant FM deviation). However, at the higher frequencies where the control voltage must be at a higher level, the resultant modulation falls off substantially (because the voltage provided is too large, creating a change in capacitance and a gain factor $K_o$ that are too high to result in the same constant FM deviation).

The failure to provide constant modulation may cause a radio to fail to meet government regulations. Normally, government regulations specify a constant level of maximum modulation from a transmitter at each frequency at which the transmitter is operated.

As illustrated in U.S. Pat. No. 4,649,353, one approach to "flattening" the modulation response utilizes an adaptive charge-pump at the input to the loop filter to compensate for the non-constant modulation (where a loop filter in a conventional frequency synthesizer filters the control voltage provided by a phase detector before feeding the control voltage into the VCO). For this approach, the preferred embodiment utlizes three transistors to reciprocally compensate for the nonlinear gain factor $K_o$.

Another approach, illustrated in U.S. Pat. No. 4,510,465, utilizes an audio compensator that uses the control voltage at the input to the loop filter to couple an output signal into the VCO. A single transistor is utilized to provide for a substantially constant gain factor $K_o$.

SUMMARY OF THE INVENTION

It is an object of the present invention to provide an improved voltage control oscillator having a flat modulation response without regard to the value of the gain factor $K_o$. Another object of the present invention is to provide a relatively low cost constant modulation frequency synthesizer.

A compensated voltage controlled oscillator having a substantially constant modulation level is provided. A voltage controlled oscillator (VCO) has a compensated modulation input and an adaptive input for receiving an adaptive signal. Compensation means includes a modulation input for receiving a modulating signal and capacitance means having a variable capacitance for coupling the modulating signal to the compensated input of the VCO. The compensation means also includes a control input for receiving a control signal and varies its capacitance in response to said control signal for providing a compensated modulated signal to the compensated input of the VCO.

DESCRIPTION OF THE PREFERRED EMBODIMENT

Figure 1:
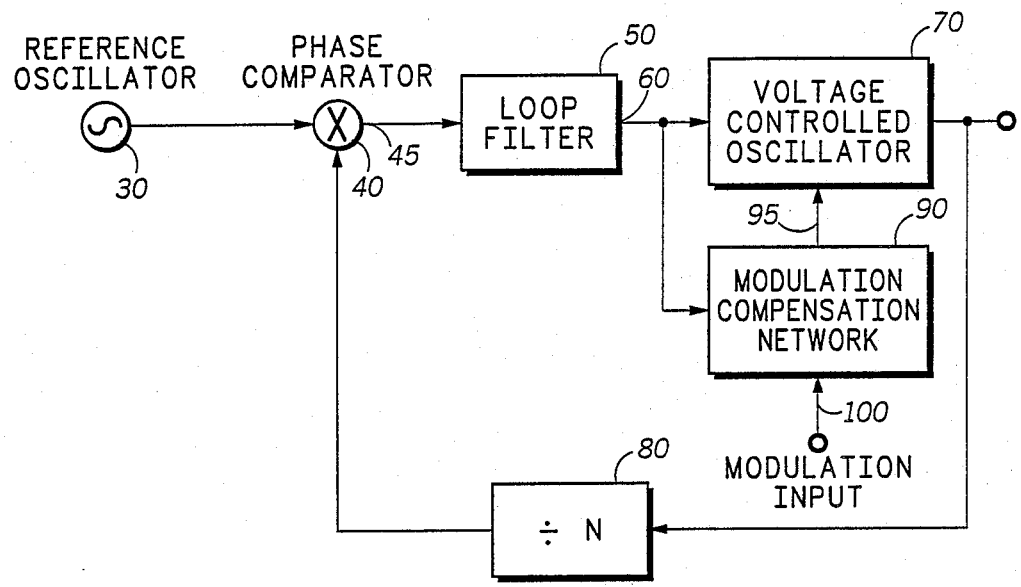
FIG. 1 is a block diagram of a synthesized voltage controlled oscillator in accordance with the present invention.

Referring to FIG. 1, a frequency synthesizer block diagram utilizing the compensated VCO of the present invention is shown. The synthesizer block diagram includes a reference oscillator 30 for providing a standard reference frequency for the synthesizer. The output of reference oscillator 30 is coupled to one input of a phase detector (or phase comparator) 40. The phase detector's output 45 provides a control voltage, which is filtered by a loop filter 50. The filtered control voltage appearing at an output 60 of loop filter 50 is applied to an input of a voltage controlled oscillator (VCO) 70, and comprises an adaptive input. An output of the VCO 70 provides a radio frequency signal that may be utilized, for example by a radio transmitter. The output of VCO 70 is also fed back to the second input of phase comparator 40. If frequency multiplication is desirable, as it is in most frequency synthesizers, a frequency divider (which may be a programmable frequency divider 80) may be disposed between the VCO output and the phase detector's second input, as shown in FIG. 1.

In the present invention, a modulation compensation network 90, comprising a compensation means, is included. Signals to be modulated (which may be audio signals) are supplied to a modulation input 100 of the modulation linearizer network 90. The filtered control voltage signal present at the output 60 of loop filter 50 is coupled to a second input of the modulation compensation network 90, and comprises a control input. The output of the modulation linearizer network 95 is coupled to a modulation port of the VCO 70, and comprises a compensated modulation input.

Figure 2:
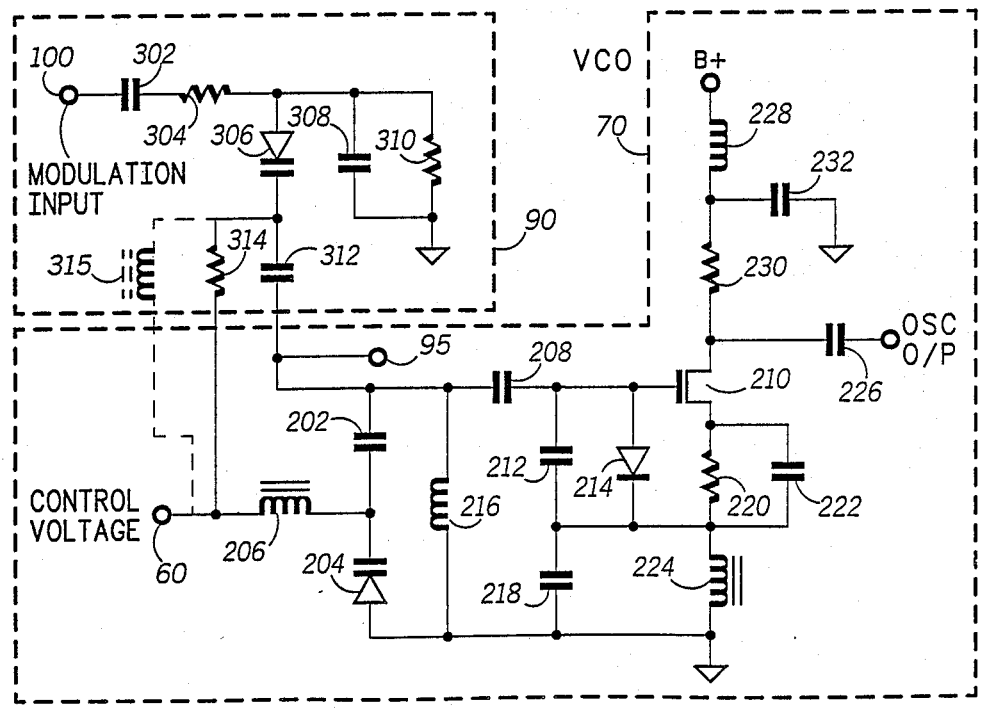
FIG. 2 is a schematic diagram of the modulation compensation network and voltage controlled oscillator of FIG. 1.

Referring to FIG. 2, a schematic diagram of the VCO 70 and the modulation compensation network 90 are shown. Voltage control oscillator 70 includes a capacitor 202 coupled from the modulation linearizer input port (95) of VCO 70 to the cathode of a varactor diode 204, which has its anode coupled to ground. An RF choke 206 is coupled from the filtered control voltage input (60) of VCO 70 to the junction of the cathode of varactor diode 204 and capacitor 202. Also coupled to the modulaton linearizer input port (95) of the VCO is a coupling capacitor 208. The other terminal of capacitor 208 is coupled to the junction of the drain of an N channel FET 210, a capacitor 212, and a Schottky diode 214. An inductor 216 is also coupled from the modulation linearizer network input port (95) of VCO 70 to ground. The other terminal of capacitor 212 is coupled to a capacitor 218 having its other terminal connected to ground. The cathode of the Schottky diode 214 is coupled to the junction of the second terminal of capacitor 212, a resistor 220, a capacitor 222 and an RF choke 224. Coupled to ground, is the other terminal of choke 224. The other terminals of resistor 220 and capacitor 222 are coupled to the source of FET 210. The drain of FET 210 provides the output of the VCO through a capacitor 226. An RF choke 228 connects the drain of FET 210 to a B+ voltage supply, constituting a bias voltage means, via a resistor 230. A capacitor 232 couples the junction of inductor 228 and resistor 230 to ground.

The modulation input of modulation linearizer network 90 is coupled via an RF bypass capacitor 302 to a resistor 304. The other terminal of resistor 304 is coupled to the anode of a varactor diode 306, which comprises a capacitance means, an RF bypass capacitor 308 and a resistor 310, which provides for a DC return path to ground. The other terminal of capacitor 308 is also coupled to ground. Filtered control voltage is applied to the junction of a coupling capacitor 312 and the cathode of varactor diode 306 by a biasing resistor 314, comprising the control means. Biasing resistor 314 and the varactor diode 306 comprise a compensation means. The other terminal of coupling capacity 312 provides the output of the modulation linearizer network 90 to VCO 70.

Voltage control oscillator 70 is shown as a tapped capacitance Colpitts oscillator, but other oscillator configurations could be utilized. Basically, in operation, the inductor 216 is resonated with the series combination of the capacitor 202 and the varactor diode 204 to form the main "tank circuit" of the VCO 70 and comprises a resonance means. Series capacitors 214 and 218, which form a voltage divider, provide impedance matching and are selected to optimize the oscillator noise figure. Resistor 220 and capacitor 222 constitute an impedance means where the resistor 220 provides the necessary DC bias voltage for starting the oscillator, while the capacitor 222 serves as the AC bypass capacitor. The FET 210 obtains DC bias through the inductors 228 and 224 and the resistors 230 and 220. Resistors 230 and 220 set the bias of FET 210, while inductors 228 and 224 decouple radio frequency energy from ground allowing it to be fed back via capacitor 222. Inductor 228, resistor 230, and capacitor 226 along with capacitor 232 serve as a matching network to obtain maximum power output into a 50 ohm load over the frequency range of interest. Choke 224 provides a DC supply path to the source of FET 210. Frequency control voltage is derived from the output of the loop filter 50 and is coupled to the oscillator through the resistor 314 and the coupling capacitor 312. The Schottky diode 220 is utilized to clip the positive going voltages across the gate-source junction of FET 210 to a value less than 0.2 volts. It will be understood that inductor 216 could be replaced by other simple or complex reactive elements (such as strip lines, transmission lines, etc.).

Modulation linearizer network 90 operates as a voltage divider. The amount of voltage division that takes place is a function of the value of the biasing resistor 314 and the biasing of the varactor diode 306. The filtered control voltage applied to the resistor 314 adaptively adjusts the varactor diode 306 as necessary to maintain constant modulation as the VCO is being tuned across the frequencies of interest.

As the filtered control voltage increases, the capacitance of the varactor diode 306 as biased by the resistor 314 will decrease, and hence decrease the total capacitance coupled into the main resonant tank of the VCO (the total capacitance is the series combination of the capacitor 312 and the varactor diode 306). As a result, the value of the capacitance of the varactor diode directly controls the change in total capacitance coupled into the main VCO tank. Therefore, at the higher frequencies when the control voltage increases, the total capacitance decreases as determined by the smaller value of the capacitance of the varactor diode 306. Conversely, at the lower oscillator frequencies, the control voltage decreases and the change in total capacitance increases due to an increase in value of the capacitance of the varactor diode 306. This compensates the modulation signal to produce a constant modulation of the main VCO tank over the frequency band.

It will be appreciated by those skilled in the art of phase-locked loop frequency synthesizers that the input into the resistor 314 may be taken from the output of a D/A converter connected to a microprocessor instead of from the output of the loop filter. This more complex compensation network may be employed to provide greater and more direct control of the modulation response. Optionally, the resistor 314 may be replaced by an RF choke 315 to supply a signal derived from the loop filter 50 or from another source, such as the D/A microprocessor combination, into the control input of the modulation linearizer network 90.

We claim as our invention:

1. A compensated voltage controlled oscillator having a substantially constant modulation levl, comprising:
   a voltage controlled oscillator (VOC) having a compensated modulation input and an adaptive input for receiving an adaptive signal; and
   compensation means including a modulation input for receiving a modulating signal and capacitance means having a variable capacitance for coupling said modulating signal to said compensated modulation input of said VCO, said compensation means including a control input for receiving an unadjusted control signal, said capacitance means varying its capacitance in response to said unadjusted control signal for providing a compensated modulated signal to said compensated input of said VCO.

2. The compensated voltage controlled oscillator arrangement of claim 1 wherein said modulating signal is an audio signal.

3. The compensated voltage controlled oscillator arrangement of claim 1 wherein said unadjusted control signal comprises a control voltage.

4. The compensated voltage controlled oscillator arrangement of claim 1 wherein said unadjusted control signal is the same as said adaptive signal.

5. The compensated voltage controlled oscillator arrangement of claim 1 wherein said adaptive signal is derived from a filtered control signal.

6. The compensated voltage control oscillator arrangement of claim 1 wherein said capacitance means comprises:
   a varactor diode; and
   said control input is coupled to said varactor diode.

7. The compensation means of claim 6 wherein a resistor couples said control input to said varactor diode.

8. The compensation means of claim 6 wherein a choke couples said control input to said varactor diode.

* * * * *